(12) United States Patent
Hu et al.

(10) Patent No.: US 6,507,090 B1
(45) Date of Patent: Jan. 14, 2003

(54) FULLY SILICIDE CASCADED LINKED ELECTROSTATIC DISCHARGE PROTECTION

(75) Inventors: David Hu, Singapore (SG); Jun Cai, Singapore (SG)

(73) Assignee: Nano Silicon Pte. Ltd., Singapore (SG)

( * ) Notice: Subject to any disclaimer, the term of this patent is extended or adjusted under 35 U.S.C. 154(b) by 0 days.

(21) Appl. No.: 09/999,229

(22) Filed: Dec. 3, 2001

(51) Int. Cl.$^7$ .................... H01L 27/082; H01L 27/102; H01L 29/70; H01L 31/11
(52) U.S. Cl. ...................................... 257/586; 438/343
(58) Field of Search ................. 257/565, 590, 257/587, 577, 575, 107, 173, 363, 491, 910, 558, 559, 592, 596, 355, 356, 357, 358, 359, 360, 585, 589; 361/58, 91, 96, 98

(56) References Cited

U.S. PATENT DOCUMENTS

| | | | |
|---|---|---|---|
| 5,043,782 A | 8/1991 | Avery | 357/23.13 |
| 5,103,281 A * | 4/1992 | Holloway | 357/43 |
| 5,519,242 A | 5/1996 | Avery | 257/356 |
| 5,559,352 A | 9/1996 | Hsue et al. | 257/328 |
| 5,602,404 A * | 2/1997 | Chen et al. | 257/112 |
| 5,689,133 A | 11/1997 | Li et al. | 257/361 |
| 5,898,205 A | 4/1999 | Lee | 257/355 |
| 5,969,923 A | 10/1999 | Avery | 361/56 |
| 6,268,639 B1 * | 7/2001 | Li et al. | 257/577 |
| 6,281,554 B1 * | 8/2001 | Pan | 257/357 |
| 6,348,724 B1 * | 2/2002 | Koomen et al. | 257/577 |

FOREIGN PATENT DOCUMENTS

JP 406232393 A * 8/1994

OTHER PUBLICATIONS

Chen et al., "Design Methodology and Optimizaion of Gate–Driven NMOS ESD Protection Circuits in Submicron CMOS Processes," IEEE Trans. on Electron Devices, vol. 45, No. 12, Dec. 1998, pp. 2448–2456.

Amerasekera et al., "Correlating Drain Junction Scaling, Salicide Thickness, and Lateral NPN Behavior, with the ESD/EOS Performance of a 0.25 um CMOS Process", 1996 IEEE, IEDM 96–893 to 96–896.

Polgreen et al., "Improving the ESD Failure Threshold of Silicided n–MOS Output Transistors by Ensuring Uniform Current Flow," IEEE Trans. on Electron Devices, vol. 39, No. 2, Feb. 1992, pp. 379–388.

Notermans et al., "The Effect of Silicide on ESD Performance," IEEE 1999, 37th Annual International Reliability Physics Symposium, San Diego, CA, pp. 154–158.

Charvaka Duvvury, "ESD: Design for IC Chip Quality and Reliability" 2000 IEEE, pp. 251–259.

* cited by examiner

Primary Examiner—Olik Chaudhuri
Assistant Examiner—Dana Farahani
(74) Attorney, Agent, or Firm—George O. Saile; Stephen B. Ackerman; William J. Stoffel

(57) ABSTRACT

A method and a structure of for an Electro Static Discharge (ESD) device that is silicided. There are three preferred embodiments of the invention. The first embodiment has a N/P/N structure. The emitter, the collector and the substrate form a parasitic transistor and the substrate is connected to the p+ diffusion region. The emitter and the substrate act as a first diode D1 and the collector and the substrate act as a second diode D2. The second embodiment has a first N+ well between a second n+ (collector) region and a P+ base region. The Vt1 is controlled by the dopant profiles of the P+ base and the n– first well where they intersect. The third embodiment is similar to the second embodiment, but the n– well covers all of drain. A parasitic NPN bipolar transistor comprises: an emitter, a parasitic base and a drain. The emitter is formed by the first n+ region. The parasitic base is formed by the p-substrate. The collector is formed by the second n+ region and the first n– well. The Vt1 is controlled by the dopant profiles of the P+ base and the n– first well where they intersect.

18 Claims, 6 Drawing Sheets

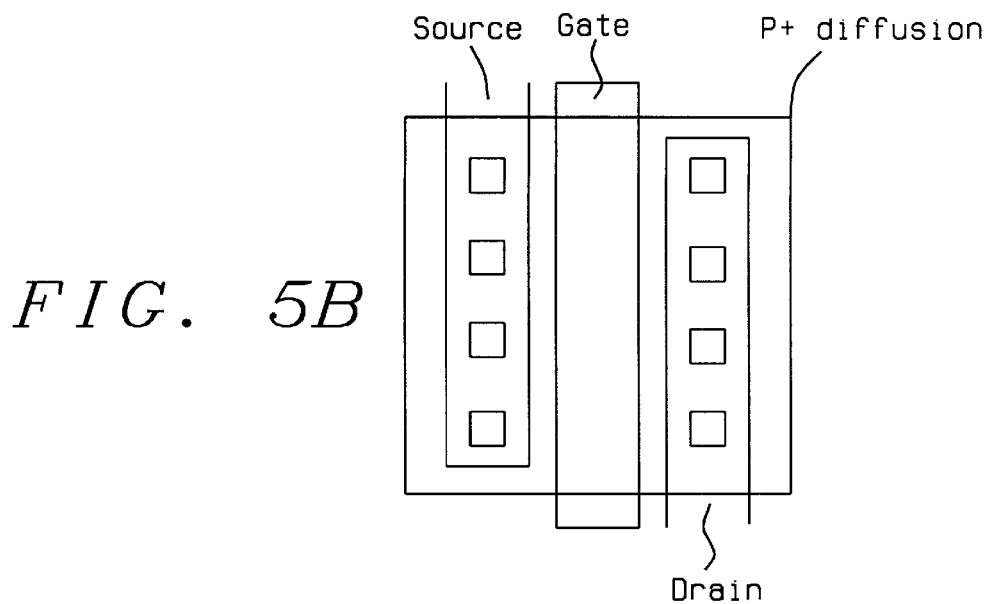
*FIG. 5B*
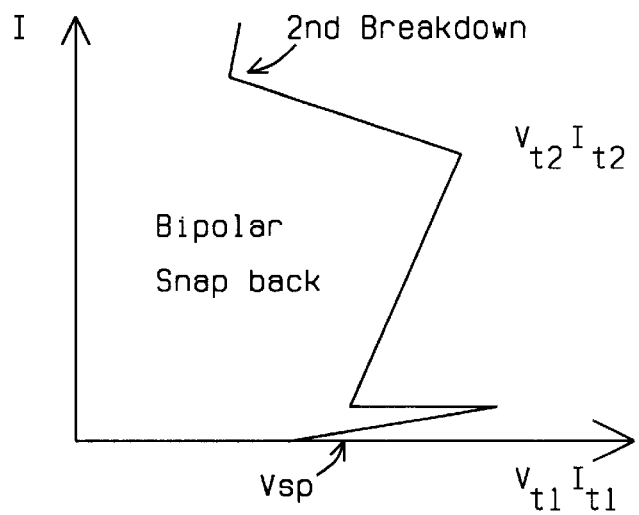
*FIG. 5C – Prior Art*
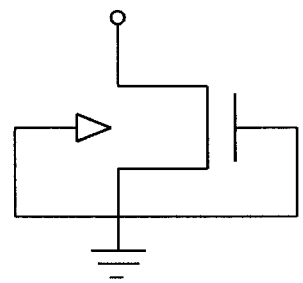
*FIG. 5D – Prior Art*

FULLY SILICIDE CASCADED LINKED ELECTROSTATIC DISCHARGE PROTECTION

BACKGROUND OF INVENTION

1) Field of the Invention

This invention relates generally to fabrication of semiconductor devices and more particularly to the fabrication of an Electro Static Discharge (ESD) device and more particularly an Electro Static Discharge (ESD) device using a silicide process. The invention related to a device for on-chip ESD protection.

2) Description of the Prior Art

The n-type MOS transistor has been widely employed as the primary component for an ESD protection circuit in semiconductor IC devices. It is well known that silicidation of the drain and LDD junctions reduce ESD performance significantly. Most saliciding process have a removal option which allows unsalicided areas (e.g., resistors) to be formed and use ESD implant to make junction deeper and to overdose the lightly doped region of the LDD for better ESD performance.

NMOS transistors stacked in a cascade configuration provide robust ESD protection for mixed voltage I/O in both silicided and silicide-blocked technologies. However, this kind of device has high snapback voltage. Also, the high snapback voltage of the stacked NMOS degrades its IT2 (IT2 is the second breakdown trigger current)) since the power dissipation is great. The IT2 is the current at or before the MOS gets into secondary breakdown (thermal/permanent damages) The higher the It2, the more robust the NMOS and the higher the ESD threshold. For the process technology where the silicide block and abrupt junction steps were not available, a biasing network was necessary to ensure uniform triggering of all fingers. So, the need for high voltage tolerant I/O's severely complicates ESD protection.

FIG. 5A shows a single poly N-MOS device that is used in the prior art as an ESD device. The structure and snap back mechanism are described below. The single-poly N-MOS device is shown in cross section and layout in FIG. 5A. FIG. 5B shows a top plan view. FIG. 5C shows the IV curve and snap back curve for the ESD device. Vsp is the snapback holding voltage. FIG. 5D shows the electrical schematic of the device in FIG. 5A. When a short-duration (100 to 110 ns) constant current pulse is applied to the drain with the source and gate tied to the substrate (substrate grounded), the device should have the I-V characteristic shown in FIG. 5C. At normal operation, the device is off because the gate is grounded. When the drain breakdown voltage, BVdss is reached, current starts to flow as a result of impact ionization of die reverse-biased drain junction. At current It1, and voltage Vt1, the device triggers into snapback. The trigger current It1 and voltage is related to the channel length and BVdss. Note that the trigger point (Vt1, It1,) is not the same as BVdss. BVdss, usually is defined as the drain junction avalanche breakdown voltage at a specified drain current density. The trigger point is the point that has the highest voltage just before snapback. The snapback region of the I-V curve is roughly linear and, therefore, may be represented by a snapback voltage Vsb and a differential resistance Rsb. The snapback voltage Vsb is defined as the linear extrapolation of the snapback region back to zero current. Care must be taken to avoid defining Vb and Rb by extrapolating from low current values near the point where the I-V curve changes slope from negative to positive. Therefore, the values of Vsb and Rsb were obtained from measurements made at high currents with the transmission-line pulse technique. Because the high-current values are relevant to ESD events, we need to use them rather than the low-current values when designing for protection against ESD. With sufficiently high current It2, flowing in the snapback region, the device triggers into second breakdown. We define a second trigger point (Vt2, It2) corresponding to the triggering from snapback into second breakdown. Second breakdown is the term used for power bipolar devices to indicate the regime of thermal runaway and current-instability.

The following patents show related ESD devices: U.S. Pat. No. 5,898,205(Lee), U.S. Pat. No. 5,519,242(Avery), U.S. Pat. No. 5,969,923(Avery), U.S. Pat. No. 5,559,352 (Hsue et al.), U.S. Pat. No. 5,043,782(Avery) and U.S. Pat. No. 5,689,113(Li et al.).

SUMMARY OF THE INVENTION

It is an object of the present invention to provide a structure of an Electro Static Discharge (ESD) device that provides better protection without process changes and additional costs.

It is an object of the present invention to provide an IC design having a structure of an Electro Static Discharge (ESD) device to be used in IC chip manufactured with a silicided process.

It is an object of the present invention to provide a method and a structure of an ESD device that overcomes the problems associated with silicided drains.

It is an object of the present invention to provide a method and a structure of an ESD device for a silicided process that does not add any extra processes steps or cost.

To accomplish the above objectives, the present invention provides a method and a structure of for an Electro Static Discharge (ESD) device that is silicided. There are three preferred embodiments of the invention.

The first embodiment has a butted N/P/N structure. The emitter, the collector and the substrate form a parasitic transistor and the substrate is connected to the p+ diffusion region. The emitter and the substrate act as a first diode D1. The collector and the substrate act as a second diode D2. The butted NPN structure is important because it ensures that the first triggering voltage sufficiently lower than the gate oxide breakdown.

The second embodiment has a first N+ well between a second N+ (collector) region and a P+ base region. The Vt1 is controlled by the dopant profiles of the P+ base and the n– first well where they intersect.

The third embodiment is similar to the second embodiment, but the n– well covers all of drain. A parasitic NPN bipolar transistor comprises an emitter, a parasitic base and a drain. The emitter formed by the first n+ region. The parasitic base formed by the p-substrate. The collector formed by the second n+ region and the first n– well. The Vt1 is controlled by the dopant profiles of the P+ base and the n– first well where they intersect.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 5B shows a top plan view of the single poly N-MOS device shown in FIG. 5A according to the prior art.

FIG. 5C shows the IV curve and snap back curve for the ESD device according to the prior art.

FIG. 5D shows the electrical schematic of the device in FIG. 5A according to the prior art.

DETAILED DESCRIPTION OF THE PREFERRED EMBODIMENTS

The present invention provides a method and a structure for an Electro Static Discharge (ESD) device that is silicided. There are three preferred embodiments of the invention.

Overview of the Three Preferred Embodiments

Figure 1A:
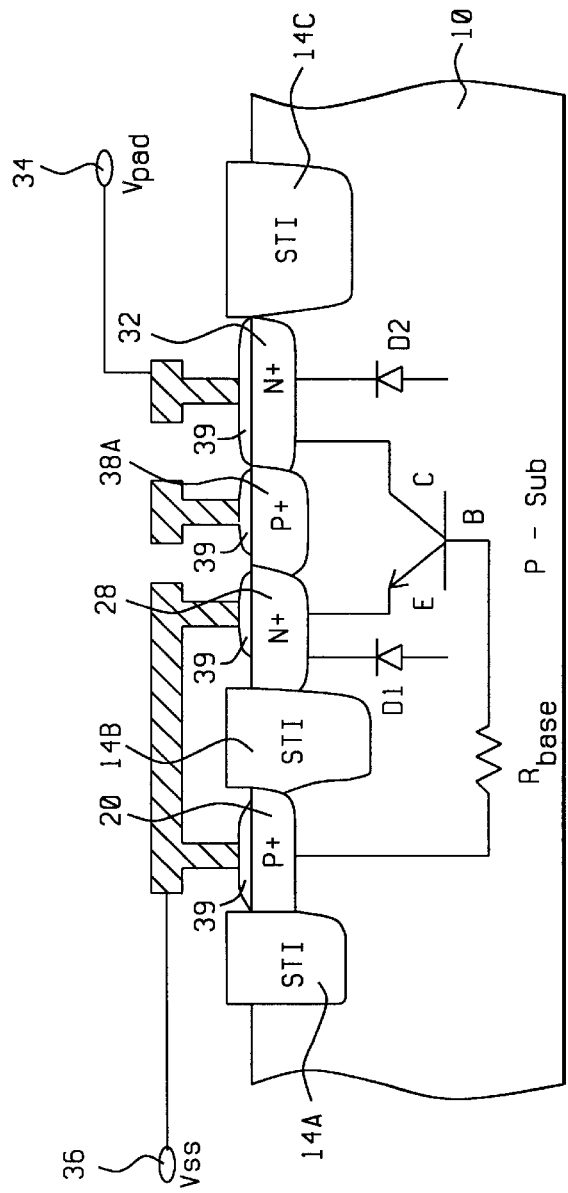
FIG. 1A is a cross sectional view of a first preferred embodiment of the Electro Static Discharge (ESD) device of the present invention.

As shown in FIG. 1A, the first embodiment has a butted N/P/N structure 28 38A 32. The emitter 28, the collector 32 and the substrate 10 form a parasitic transistor and the substrate 10 is connected to the p+ diffusion region 20. The emitter 28 and the substrate acts as a first diode D1 and the collector 32 and the substrate act as a second diode D2. The butted NPN structure is important because it ensures that the first triggering voltage sufficiently lower than the gate oxide breakdown.

Figure 2A:
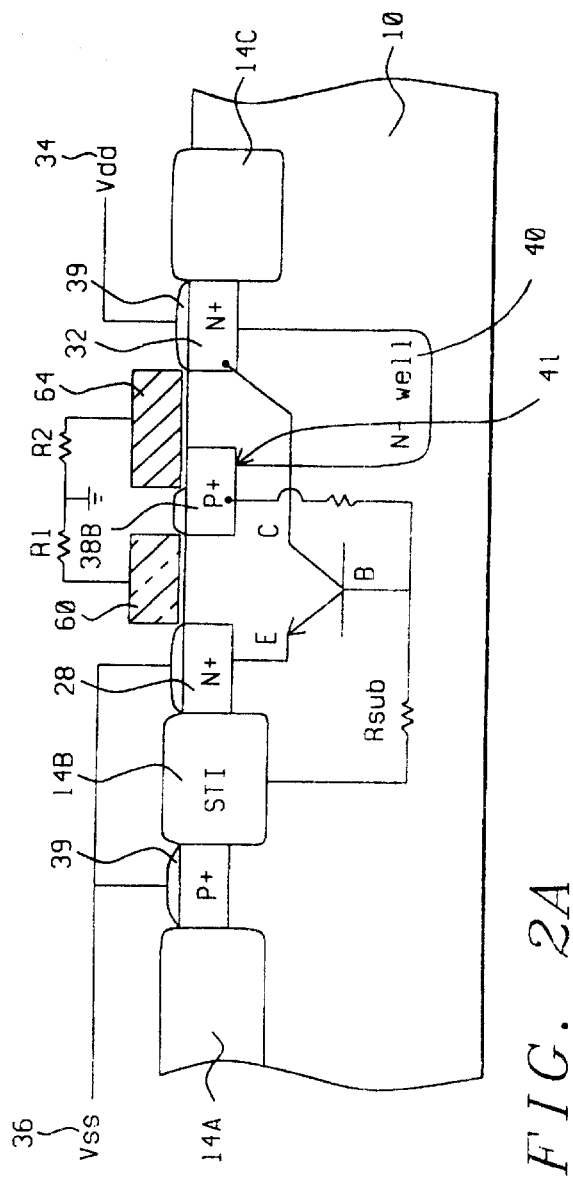
FIG. 2A is a cross sectional view of a second preferred embodiment of the Electro Static Discharge (ESD) device of the present invention.

As shown in FIG. 2A, the second embodiment has a first N+ well 40 between a second N+ (collector) region 32 and a P+ base region 38B. As shown in FIG. 2A, the Vt1 is controlled by the dopant profiles of the P+ base 38B and the n− first well 40 where they intersect at point 41.

Figure 3A:
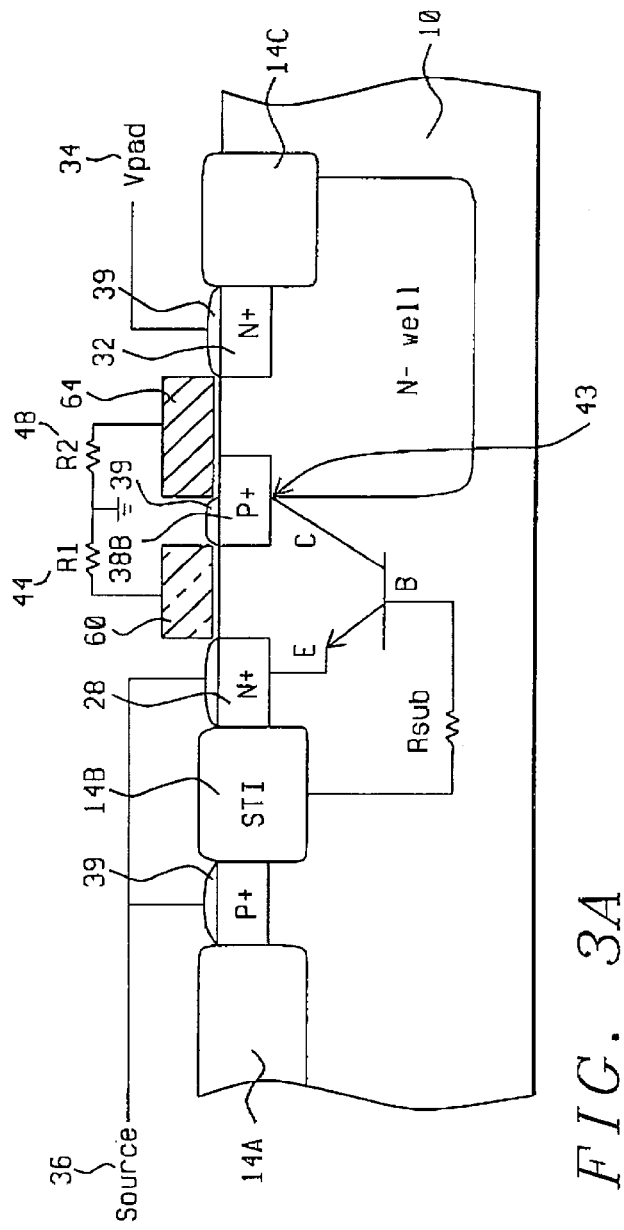
FIG. 3A is a cross sectional view of a third preferred embodiment of the Electro Static Discharge (ESD) device of the present invention.

As shown in FIG. 3A, the third embodiment is similar to the second embodiment, but the n− well 42 covers all of 32 drain. A parasitic NPN bipolar transistor comprises: an emitter 28 a parasitic base 10 and a drain 32 42. The emitter 28 formed by the first n+ region 28. The parasitic base 10 formed by the p-substrate 10. The collector formed by the second n+ region 32 and the first n− well 42. The Vt1 is controlled by the dopant profiles of the P+ base 38B and the n− first well 42 where they intersect (at point 43).

I. First Embodiment—FIGS. 1A to 1D

The first embodiment is shown in FIGS. 1A to 1D. The first embodiment is an electro-static discharge (ESD) protection device comprising the following. The ESD device of the first embodiment operates using the snap back mechanism of the parasitic Tx.

FIG. 1A shows a cross sectional view of the first embodiment. An important feature of the first embodiment is that the butted N/P/N structure 28 38A 32. Also, all the N+ and P+ diffusions have silicide contacts.

The emitter 28, the collector 32 and the substrate 10 form a parasitic transistor and the substrate 10 is connected to the p+ diffusion region 20. The emitter 28 and the substrate acts as a first diode D1. The collector 32 and the substrate act as a second diode D2.

FIG. 1A shows a lateral NPN transistor formed in a substrate. The lateral NPN transistor has an emitter 28, a base 38A and a collector 32. The emitter 28 is preferably butted against the base 38A; the base 38 preferably butted against the collector 32. The emitter, base and collects can be spaced slightly from each other and not actually butted.

A p+ diffusion region 20 separated from the emitter 28 by an isolation region 14B. The p+ diffusion region 20 is also commonly called a "substrate pickup".

Silicide regions 39 are on the p+ diffusion region 20, the emitter 28, the base 38A and the collector. The silicide regions are preferably not connected together. The silicide regions are preferably separated by isolation regions (e.g., FOX or STI).

The substrate 10 is preferably p− doped and is preferably a Si wafer. Also, the substrate can be a wafer with a p− doped well or contain other well configuration as is known to those skilled in the art.

The base 38A is preferably floating.
The substrate 10 acts as a parasitic base.
A V-pad 34 is connected the collector 32.
A Vss 36 is electrically coupled to the p+ diffusion region 20 and the emitter 28.

Figure 1B:
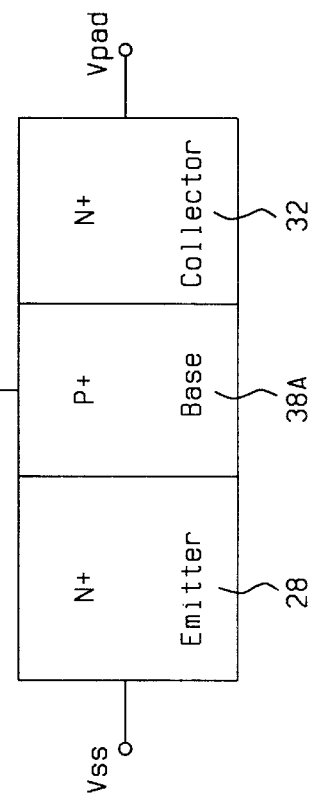
FIG. 1B is an electrical schematic of the first preferred embodiment of the NPN Tx that is part of Electro Static Discharge (ESD) device of the present invention.

FIG. 1B is a simplified electrical schematic of the first embodiments NPN Tx.

Figure 1C:
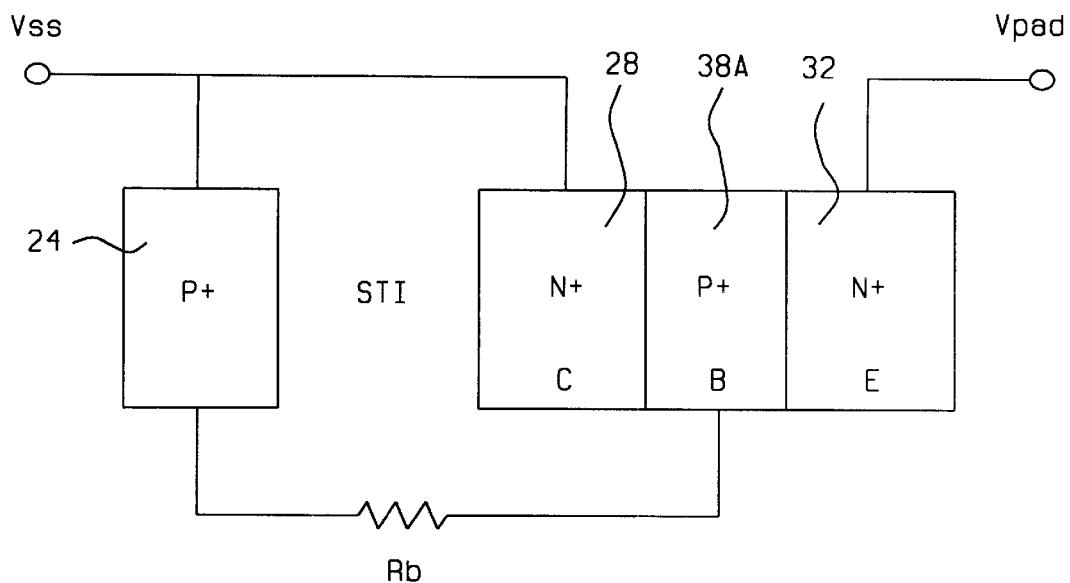
FIG. 1C is an electrical schematic of the first preferred embodiment of the Electro Static Discharge (ESD) device of the present invention.

FIG. 1C is a simplified electrical schematic of the first embodiment's ESD device.

Figure 1D:
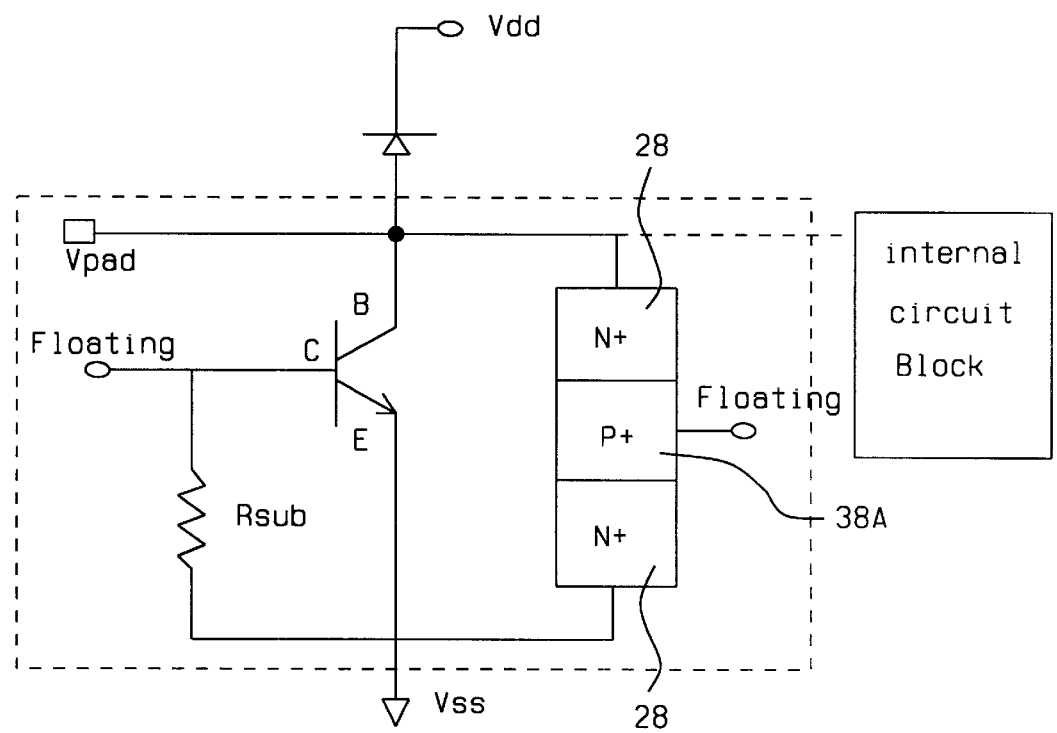
FIG. 1D is an electrical schematic of the first preferred embodiment of the Electro Static Discharge (ESD) device of the present invention.
Figure 5A:
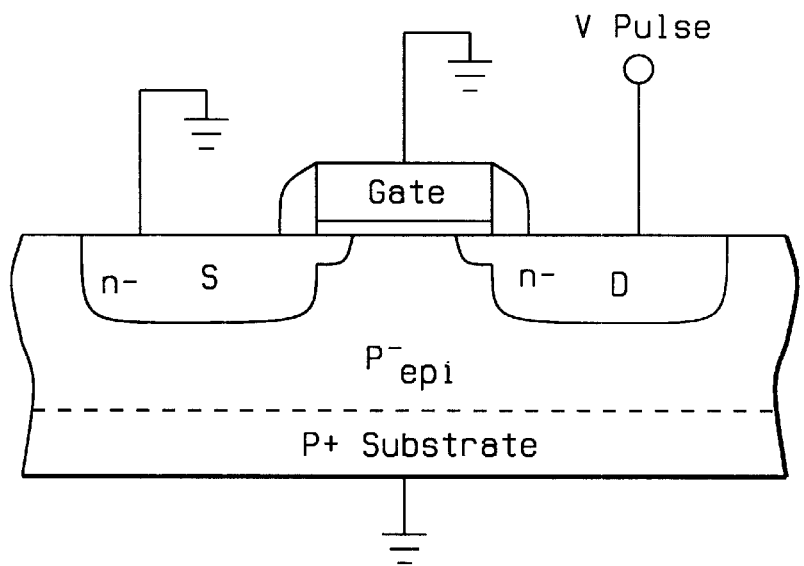
FIG. 5A shows a single poly N-MOS device that is used in the prior art as an ESD device.

FIG. 1D is a simplified electrical schematic of the first embodiment's ESD device. The invention's ESD device uses the snap back mechanism as shown in FIG. 5C. The first embodiment has the unique advantage of having lower trigger voltage and higher current capacity. However, a disadvantage is high leakage and uncontrollable snapback voltage. This is a similar problem to the zenor diode.

A. Method for First Embodiment

The method of making the first embodiment's electro-static discharge (ESD) protection device is described below and show in FIG. 1A.

First, we form isolation regions 14A 14B 14C in a substrate. The substrate 10 is p− doped. The substrate can comprise a wafer with a p− doped well or combination of N and P wells. A shallow trench isolation (STI) process preferably forms the isolation regions.

Next, doped areas are formed. The N and P doped regions can be formed in any order. The N and P doped regions can be formed by diffusion and most preferably by an ion implant (I/I) process. We form a p+ diffusion region 20 and a base 38A in a substrate 10. The base is a p+ doped region.

We form an emitter 28 and a collector 32 in the substrate 10. The emitter and the collectors are n+ doped regions.

The p+ diffusion region 20 is separated from the emitter 28 by the isolation region 14B. The emitter 28 is butted against the base 38A. The base 38A butted against the collector 32 forming silicide regions 39 on the p+ diffusion region 20, the emitter 28, the base 38A and the collector.

We connect a V-pad 34 to the collector 32.

A Vss 36 is electrically coupled (connected) to the p+ diffusion region 20 and the emitter 28.

A lateral NPN transistor is comprised of the emitter 28, the base 38A and the collector 32. The base 38A is floating.

The emitter 28, the collector 32 and the substrate 10 form a parasitic transistor and the substrate 10 is connected to the p+ diffusion region 20.

II. Second Embodiment—FIG. 2A

The second embodiment is shown in FIG. 2A. The second embodiment is an electrostatic discharge (ESD) protection device as part of n-channel MOS transistors and P– channel MOS transistors that are formed on the same substrate. The second embodiment has a first N+ well 40 between a second N+ (collector) region 32 and a P+ base region 38B. As shown in FIG. 2A, the Vt1 is controlled by the dopant profiles of the P+ base 38B and the n– first well 40 where they intersect at point 41. The ESD device of the second embodiment operates using the snap back mechanism of the parasitic TX.

The emitter 28, the collector 32 and the substrate 10 form a parasitic transistor and the substrate 10 is connect to the p+ diffusion region 24. The emitter, collector and base have the same concentrations and depths as the first embodiment.

FIG. 2 shows substrate 10 that is p– doped or has a p– doped region/well. The substrate can have a p– well and other wells.

A first n+ region 38A and a second n+ region 32 are in the substrate.

A first p+ region 20 and a second p+ region 38b are in the substrate 10.

A first n– well 40 is formed in the substrate 10. A portion of the second p+ region 38B and the second n+ region 32 abut the first n– well 40.

A first gate 64 is between the second n+ region 32 and the second p+ region 38B.

A second gate 60 is between the second p+ region 38B and the first n+ region 28.

A parasitic NPN bipolar transistor comprises: an emitter 28, a parasitic base 10, and a drain 32. The emitter 28 is formed by the first n+ region 28. The parasitic base 10 is formed by the p-substrate 10. and the collector formed by the second n+ region 32 and the first n– well 40.

The first p+ diffusion region 20 separated from the emitter 28 by an isolation region 14B. The first p+ diffusion region 20 can also be called a substrate pickup. Silicide regions 39 are on the first p+ diffusion region 20, the emitter, the base and the collector.

The base 38B is preferably floating.

A V-pad 34 is connected the collector 32.

A Vss 36 is electrically coupled to the p+ diffusion 20 and the emitter 28.

In a first option to the second embodiment, the first and second gates 60 64 are connected to a ground by through first R1 and second resistors (R2). This has the advantage of a soft-tie which is a function of reducing the triggering voltage (Vt1). The resistors (R1 and R2) shown is for some parasitic effects contributed by the metal lines, etc. However, this R can be variable to make trigger voltage lower.

As shown in FIG. 2A, the Vt1 is controlled by the dopant profiles of the P+ base 38B and the n– first well 40 where they intersect at point 41.

Figure 4:
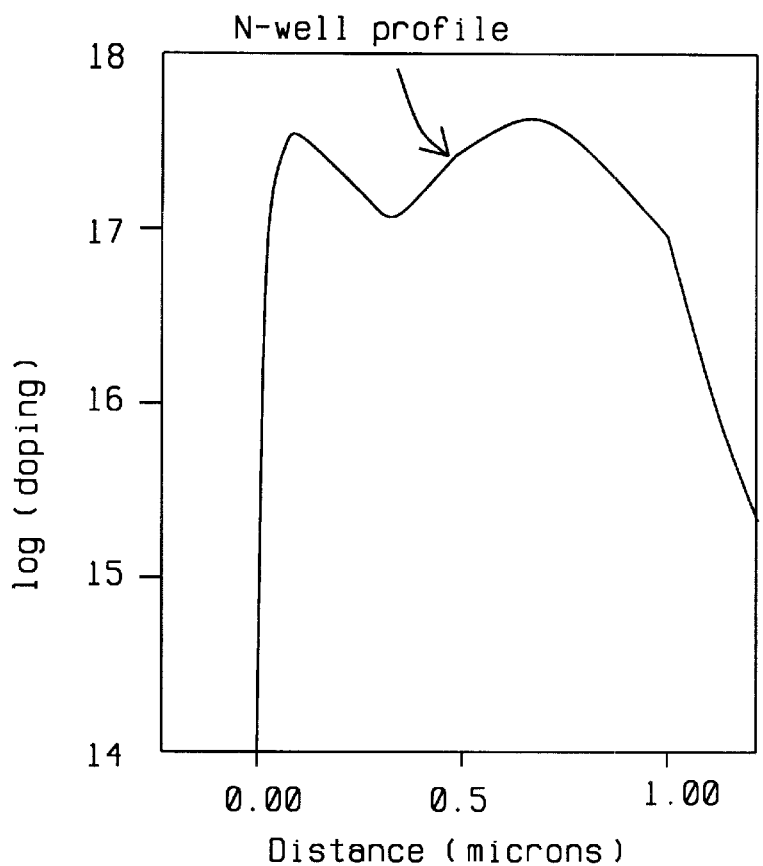
FIG. 4 is a n-well concentration profile according to the second and third embodiments of the invention.

Preferably the N– wells are a retrograde well. A retrograde well has a low sheet resistance. FIG. 4 shows an example of a retrograde n– well profile. For example, near 0.6 um position below the substrate surface, there is a maximum doping peak for n– well (and also for p– well). That means, there is a low resistance path at 0.6 um position apart from the surface. After the device snapback, most discharge current will trend to flow along this path. In the other words, discharge path far away from the silicon surface, means that the peak density heating occurring also far away from the silicon surface. The device is with a good thermal conductivity for discharge current, therefore, with a high ESD performance. The silicidation of the drain is not sensitivity for, the device ESD performance, therefore, this kind of the device can be used in fully silicide process for an idea ESD protection.

Figure 2B:
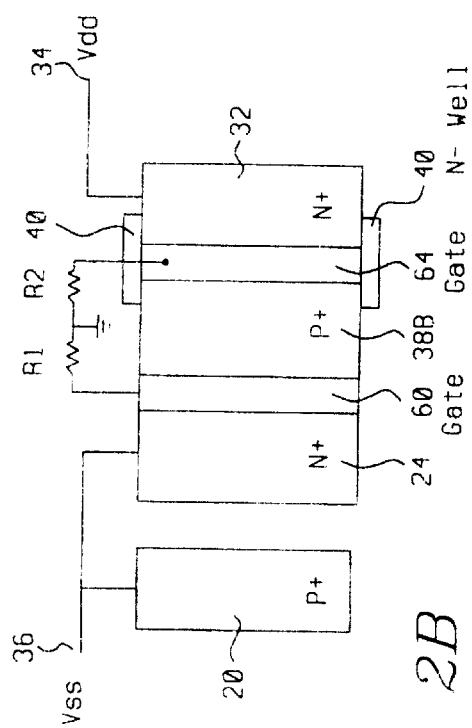
FIG. 2B is a top plan view of the a second preferred embodiment of the Electro Static Discharge (ESD) device of the present invention.

FIG. 2B shows a top down view of the second embodiment.

A. Method for the Second Embodiment

The method for the second embodiment for the electrostatic discharge (ESD) protection device is describe below and shown on FIG. 2A.

We provide a wafer with a p-substrate 10. We form a first n– well 40 formed in the substrate 10. We then form an isolation region 14B in the substrate 10. The isolation regions of preferably shallow trench isolation (STI) regions.

Next, doped regions are formed in the substrate. The doped regions can be formed in any order. We form a first n+ region 28 and a second n+ region 32 in the substrate. We also form a first p+ region 20 and a second p+ region 38b in the substrate 10. The n+ and p+ regions are preferably formed by an implant process.

A portion of the second p+ region 38B and the second n+ region 32 abutting the first n– well 40. The first p+ diffusion region 20 separated from the first n+ region 28 by the isolation region 14B.

Subsequently, we form a first gate 64 and a second gate 60. The first gate 64 is between the second n+ region 32 and the second p+ region 38B. The second gate 60 is between the second p+ region 38B and the first n+ region 28. Spacers (not shown) can be formed on the gates.

Next, silicide regions 39 are formed on the first p+ diffusion region 20, the emitter, the base and the collector.

The base 38B is preferably floating.

A parasitic NPN bipolar transistor is comprised of: an emitter 28, a parasitic base 10, and a drain 32. The emitter 28 formed by the first n+ region 28. The parasitic base 10 formed by the p-substrate 10 and the collector formed by the second n+ region 32 and the first n– well 40. The emitter, collector and base have the same concentrations and depths as the first embodiment.

We connect a V-pad 34 to the collector 32 and electrically couple a Vss 36 to the p+ diffusion 20 and the emitter 28.

In an option, we connect the first and second gates 60 64 to a ground 54 by conductive lines that are represented and act as first (R1) and second resistors (R2).

III. 3rd Embodiment—FIG. 3A

The 3rd embodiment is shown in FIG. 3A. The third embodiment is similar to the second embodiment, but the n– well 42 covers all of 32 drain.

A parasitic NPN bipolar transistor comprises: an emitter 28 a parasitic base 10 and a drain 32 42. The emitter 28 formed by the first n+ region 28. The parasitic base 10 formed by the p-substrate 10. The collector is formed by the second n+ region 32 and the first n– well 42. As shown in FIG. 3A, the Vt1 is controlled by the dopant profiles of the P+ base 38B and the n– first well 42 where they intersect at point 43.

The ESD device of the third embodiment operates using the snap back 22 mechanism of the parasitic TX.

FIG. 3A shows substrate 10 that is p– doped or has a p– doped region/well. The substrate can have a p– well and other wells.

A first n+ region 28 and a second n+ region 32 are in the substrate. A first p+ region 20 and a second p+ region 38b are in the substrate 10.

A first n– well 42 formed in the substrate 10. A portion of the second p+ region 38B abutting the first n– well 40. The second n+ region 32 completely abutted by the first n– well 42.

A first gate 64 is between the second n+ region 32 and the second p+ region 38B.

A second gate 60 is between the second p+ region 38B and the first n+ region 24.

A parasitic NPN bipolar transistor comprises: an emitter 28 a parasitic base 10 and a drain 32 42. The emitter 28 formed by the first n+ region 28. The parasitic base 10 formed by the p-substrate 10. The collector formed by the second n+ region 32 and the first n– well 42.

A p+ diffusion region 20 (or substrate pickup) separated from the emitter 28 by an isolation region 14B.

Silicide regions 39 are on the emitter, the base and the collector.

The base 38B is preferably floating.

A V-pad 34 is connected the collector 32.

A Vss 36 is electrically coupled to the p+ diffusion 20 and the emitter 28. whereby the emitter 28, the collector 32 42 and the substrate 10 form a parasitic transistor.

The substrate 10 is connect to the p+ diffusion region 24.

In a first option to the 3$^{rd}$ embodiment, the first and second gates are connected to a ground by through conductive lines that are represented and act as first (R1) and second resistors (R2).

As shown in FIG. 3A, the Vt1 is controlled by the dopant profiles of the P+ base 38B and the n– first well 42 where they intersect at point 43.

Figure 3B:
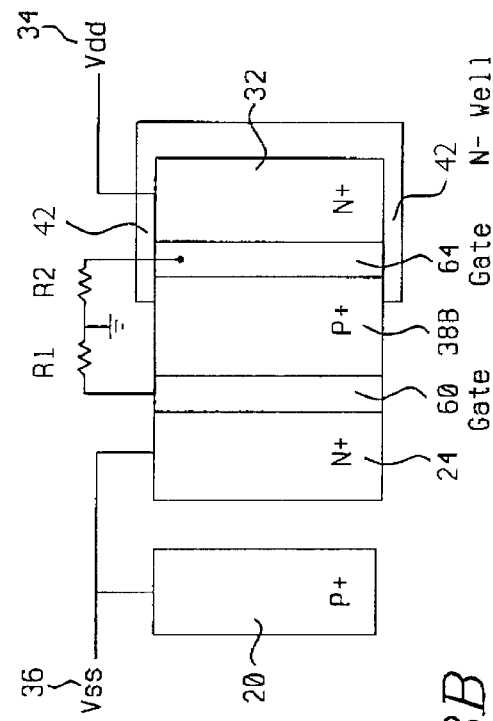
FIG. 3B is a top plan view of the third preferred embodiment of the Electro Static Discharge (ESD) device of the present invention.

FIG. 3B shows a top down view of the third embodiment. Also, a N– well can be used on variable (e.g., having N– to cover all the N+ or part of N+ region to vary the Vt1).

A. Method for the Third Embodiment

The method of making the third embodiment's electrostatic discharge (ESD) protection device is described below and shown in FIG. 3A. Unless otherwise indicated, the processes are the same as for the first and second embodiments.

A first n– well 42 is formed in the substrate 10. The substrate is p– doped.

We form isolation regions in the substrate. The isolation region 14B is spaced from the n– well.

We form a first n+ region 28 and a second n+ region 32 in a substrate.

We form a first p+ region 20, a second p+ region 38b and a P+ diffusion region 20 in the substrate 10. A portion of the second p+ region 38B preferably abuts (or is adjacent to) the first n– well 40. The second n+ region 32 is surrounded by the first n– well 42 . The p+ diffusion region 20 is separated from the emitter 28 by an isolation region 14B.

Subsequently, we form a first gate 64 and a second gate 60. The first gate 64 is between the second n+ region 32 and the second p+ region 38B. The second gate 60 is between the second p+ region 38B and the first n+ region 24.

Next, we form silicide regions 39 on the emitter, the base and the collector.

The parasitic NPN bipolar transistor (ESD device) is comprised of an emitter 28 a parasitic base 10 and a drain 32 42. The emitter 28 is formed by the first n+ region 28. The parasitic base 10 is formed by the p-substrate 10. The collector is formed by the second n+ region 32 and the first n– well 42.

We connect a V-pad 34 to the collector 32.

We electrically couple a Vss 36 to the p+ diffusion 20 and the emitter 28. The base 38B is floating.

In optional steps, the first and second gates are connected to a ground by conductive lines represented as first (R1) and second resistors (R2).

The invention is a novel structure and method for a ESD device with lower and controllable triggering voltage and higher ESD threshold (Vt2, It2) without any additional process steps (e.g., silicide block) or masking layers. The ESD device is targeted for the CMOS VLSI circuit through other process can also be applicable to the fabrication. The process for fabrication necessary to this ESD device comprised of at least a N+ source & drain on a p– well or p-substrate, lower dopant of N– gate poly and metal.

The substrate 10 can be p– doped or be any other different polarity wafer. Also, the conductivities of the N and P regions in the ESD device can be reversed.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. An electro-static discharge protection device comprising:
   a) a lateral NPN transistor formed in a substrate; said lateral NPN transistor having a emitter, a base and a collector; said emitter adjacent said base; said base adjacent said collector; said substrate is p– doped;
   b) a substrate pickup region separated from said emitter by an isolation region;
   c) silicide regions on said substrate pickup region, said emitter, said base and said collector;
   d) said substrate is a parasitic base;
   e) a V-pad is connected said collector;
   f) a Vss electrically coupled to said substrate pickup region and said emitter; whereby said emitter, said collector and said substrate form a parasitic transistor and the substrate is connected to the substrate pickup region.

2. The electrostatic discharge protection device of claim 1 wherein said base is floating.

3. An electrostatic discharge protection device, comprising:
   a) wafer with a p-substrate;
   b) a first n+ region and a second n+ region in said substrate;
   c) a first p+ region and a second p+ region in said substrate;
   d) a first n– well formed in said substrate; a portion of said second p+ region and said second n+ region abutting said first n– well;

e) a first gate between said second n+ region and said second p+ region;

f) a second gate between said second p+ region and said first n+ region;

g) a parasitic NPN bipolar transistor comprising: an emitter, a parasitic base, and a drain; said emitter formed by said first n+ region; said parasitic base formed by said p-substrate; and said collector formed by said second n+ region and said first n– well;

h) said first p+ diffusion region separated from said emitter by an isolation region;

i) silicide regions on said first p+ diffusion region, said emitter, said base and said collector;

j) a V-pad is connected said collector;

k) a Vss electrically coupled to said p+ diffusion and said emitter; whereby said emitter, said collector and said substrate form a parasitic transistor and the substrate is connect to the p+ diffusion region.

4. The electro-static discharge protection device of claim 3 wherein said p-substrate is a p– well.

5. The electro-static discharge protection device of claim 3 wherein said base is floating.

6. An electro-static discharge protection device, comprising:

a) a first n+ region and a second n+ region in a substrate; said substrate is p– doped;

b) a first p+ region and a second p+ region in said substrate;

c) a first n– well formed in said substrate; a portion of said second p+ region abutting said first n– well; said second n+ region completely abutted by said first n– well;

d) a first gate between said second n+ region and said second p+ region;

e) a second gate between said second p+ region and said first n+ region;

f) a parasitic NPN bipolar transistor comprising: an emitter a parasitic base and a drain; said emitter formed by said first n+ region; said parasitic base formed by said p-substrate; and said collector formed by said second n+ region and said first n– well;

g) a p+ diffusion region is separated from said emitter by an isolation region;

h) silicide regions on said emitter, said base and said collector;

i) a V-pad is connected said collector;

j) a Vss electrically coupled to said p+ diffusion and said emitter; whereby said emitter, said collector and said substrate form a parasitic transistor and the substrate is connect to the p+ diffusion region.

7. The electro-static discharge protection device of claim 6 wherein said base is floating.

8. A method for an electrostatic discharge protection device comprising:

a) forming an isolation region in a substrate;

b) forming a p+ diffusion region and a base in a substrate; said base is a p+ doped region;

c) forming an emitter and a collector in said substrate; said emitter and said collectors are n+ doped regions; said p+ diffusion region separated from said emitter by said isolation region; said emitter adjacent said base; said base adjacent said collector; said substrate is p– doped;

d) forming silicide regions on said p+ diffusion region, said emitter, said base and said collector;

e) connecting a V-pad to said collector;

f) electrically coupling a Vss to said p+ diffusion region and said emitter; whereby said emitter, said collector and said substrate form a parasitic transistor and the substrate is connected to the p+ diffusion region.

9. The method of claim 8 wherein said base is floating.

10. A method for an electro-static discharge protection device, comprising:

a) providing a wafer with a p-substrate;

b) forming a first n– well formed in said substrate;

c) forming an isolation region in said substrate;

d) forming a first n+ region and a second n+ region in said substrate;

e) forming a first p+ region and a second p+ region in said substrate; a portion of said second p+ region and said second n+ region abutting said first n– well; said first p+ diffusion region separated from said first n+ region by said isolation region;

f) forming a first gate and a second gate; said first gate between said second n+ region and said second p+ region; said second gate between said second p+ region and said first n+ region;

g) forming silicide regions on said first p+ diffusion region, said emitter, said base and said collector; wherein a parasitic NPN bipolar transistor is comprised of: an emitter, a parasitic base, and a drain; said emitter formed by said first n+ region; said parasitic base formed by said p-substrate; and said collector formed by said second n+ region and said first n– well; whereby said emitter, said collector and said substrate form a parasitic transistor and the substrate is connect to the p+ diffusion region.

11. The method of claim 10 which further includes connecting a V-pad to said collector; and electrically coupling a Vss to said p+ diffusion and said emitter.

12. The method of claim 10 which further includes connecting said first and second gates to a ground by through a conductive path.

13. The method of claim 10 wherein said isolation regions are shallow trench isolation regions.

14. The method of claim 10 wherein said base is floating.

15. A method for an electro-static discharge protection device, comprising:

a) forming a first n– well formed in said substrate; said substrate is p– doped;

b) forming an isolation region in said substrate;

c) forming a first n+ region and a second n+ region in a substrate, d) forming a first p+ region, a second p+ region and a P+ diffusion region in said substrate; a portion of said second p+ region abutting said first n– well; said second n+ region surrounded by said first n– well; a p+ diffusion region separated from said emitter by an isolation region;

e) forming a first gate and a second gate; said first gate is between said second n+ region and said second p+ region; a second gate between said second p+ region and said first n+ region;

f) forming silicide regions on said emitter, said base and said collector; wherein a parasitic NPN bipolar transistor comprises: an emitter a parasitic base and a drain; said emitter formed by said first n+ region; said parasitic base formed by said p-substrate; and said collector formed by said second n+ region and said first n– well whereby said emitter, said collector and said substrate form a parasitic transistor and the substrate is connect to the p+ diffusion region.

16. The method of claim 15 which further includes connecting a V-pad to said collector;
electrically coupling a Vss to said p+ diffusion and said emitter; and said base is floating.

17. An electro-static discharge protection device comprising:
   a) a lateral NPN transistor formed in a substrate; said lateral NPN transistor having a emitter, a base and a collector; said emitter adjacent said base; said base adjacent said collector; said substrate is p– doped; said base is a doped region in said substrate; said base has a different concentration than said substrate;
   b) a substrate pickup region separated from said emitter by an isolation region;
   c) silicide regions on said substrate pickup region, said emitter, said base and said collector;
   d) said substrate is a parasitic base;
   e) a V-pad is connected said collector;
   f) a Vss electrically coupled to said substrate pickup region and said emitter; whereby said emitter, said collector and said substrate form a parasitic transistor and the substrate is connected to the substrate pickup region.

18. The electrostatic discharge protection device of claim 17 wherein said base is floating.

* * * * *

UNITED STATES PATENT AND TRADEMARK OFFICE
CERTIFICATE OF CORRECTION

PATENT NO. : 6,507,090 B1  Page 1 of 1
APPLICATION NO. : 09/999229
DATED : January 14, 2003
INVENTOR(S) : Hu et al.

It is certified that error appears in the above-identified patent and that said Letters Patent is hereby corrected as shown below:

Sheet 4 of 6, Figure 3A, add reference character 42, as follows:

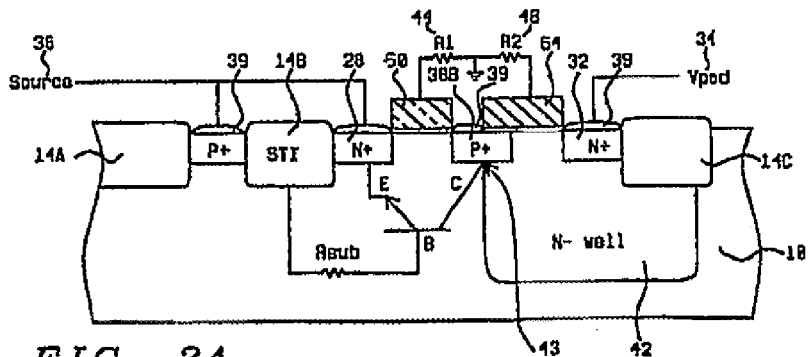

FIG. 3A

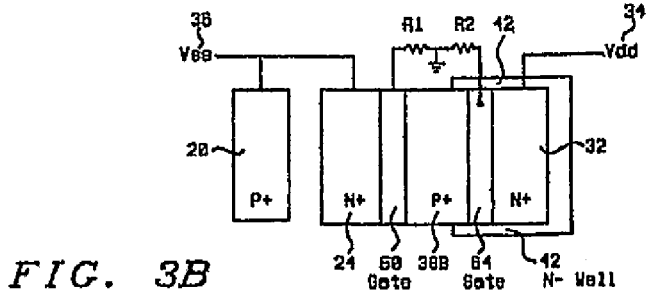

FIG. 3B

Signed and Sealed this

Fourth Day of September, 2007

JON W. DUDAS
*Director of the United States Patent and Trademark Office*